United States Patent
Rokhvarger et al.

(10) Patent No.: US 6,617,284 B1
(45) Date of Patent: *Sep. 9, 2003

(54) SUPERCONDUCTOR COMPOSITE MATERIAL

(76) Inventors: Anatoly Rokhvarger, 1865 Ocean Ave., Apt. 4B, Brooklyn, NY (US) 11230; Mikhail I. Topchiashvili, 47 77th St., Brooklyn, NY (US) 11209

( * ) Notice: Subject to any disclaimer, the term of this patent is extended or adjusted under 35 U.S.C. 154(b) by 0 days.

This patent is subject to a terminal disclaimer.

(21) Appl. No.: 09/788,239

(22) Filed: Feb. 16, 2001

Related U.S. Application Data

(63) Continuation-in-part of application No. 09/408,209, filed on Sep. 29, 1999, now Pat. No. 6,239,079, which is a continuation-in-part of application No. 09/110,580, filed on Jul. 6, 1997, now Pat. No. 6,010,983.

(51) Int. Cl.$^7$ .............................. H01L 39/24; B32B 1/52; H01B 13/22
(52) U.S. Cl. ..................... 505/500; 505/430; 505/431; 505/433; 505/470; 505/490; 505/739; 264/241
(58) Field of Search ................................. 505/121, 124, 505/125, 126, 235, 440, 500, 431, 433, 434, 470, 490, 739, 822; 264/241

(56) References Cited

U.S. PATENT DOCUMENTS 5,284,822 A * 2/1994 Sakai et al. .................... 505/1
5,902,774 A * 5/1999 Muranaka et al. .......... 505/433

* cited by examiner

Primary Examiner—Mark Kopec
(74) Attorney, Agent, or Firm—I. Zborovsky

(57) ABSTRACT

A superconductor composite material consists of sintering products of interaction of superconductor ceramics with silicone material. The superconductor composite material can also include at least one metal, metal oxide or halogen element dope that interacts with superconductor ceramics and silicone residuals at sintering high temperature. The suspension or slurry of superconductor ceramics, silicone and dope powders can be used for coating of the particular substrate. Such coating employs modified forming methods including dip coating, painting, slip casting, cladding, printing, and spraying in order to produce continuous superconductor filament, wire, tape, coil, large size screen, and small chip or electronic element. The condensed suspension is used for extrusion, injection molding, and pressing continuous and short superconductor tubes, rods, beams, rails as well as disks, rings and other bulk shaped materials.

10 Claims, No Drawings

SUPERCONDUCTOR COMPOSITE MATERIAL

This is a continuation-in-part of application Ser. No. 09/408,209, filed Sep. 29, 1999, now U.S. Pat. No. 6,239,079 which is a continuation-in-part of application Ser. No. 09/110,580, now U.S. Pat. No. 6,010,983 filed Jul. 6, 1997.

BACKGROUND OF THE INVENTION

The present invention relates to superconductor (superconductive) composite material. High temperature superconductor (HTS) ceramics or superconductor ceramics (SC) discovered towards the end of 1980's are very chemically active, brittle and degrade under environmental and magnetic field influences. Until now it was unknown how to avoid these disadvantages so as to allow practical use of the SC ceramics. For example, it was not known how to make continuous and quality assured HTS wires and coils, shaped films and variously shaped products from these very fragile ceramics to produce practical and inexpensive electrical energy and electronics products for various applications. It is believed to be clear that it is very important to develop a superconductor ceramic composite material with high technological workability of the raw material composition, which makes possible cost-effective manufacturing of all necessary products for the Electrical, Electronics and Internet industries, avoiding disadvantages of the prior art.

SUMMARY OF THE INVENTION

Accordingly, it is an object of the present invention to provide an innovative superconductor composite material with significantly improved and increased electrical-magnetic and structural properties, such as strain tolerance and ductility, which has practical acceptable reliability and durability in the air and in working conditions at temperatures about 77 K. It is also an object of the present invention to provide a new material of this type from a workable raw material composition. The chosen method of the raw materials preparation is the inexpensive wet method, which causes huge potential for inexpensive and workable material forming. The wet method consists of making a ceramic suspension or slurry of the fine powder particles of superconductor ceramics with or without a dope or an additive in a silicone rubber or silicone lacquer emulsion in toluene or acetone. The use of the ceramic suspension provides significant advantages for superconductor technology and material properties in comparison with prior arts while liquid or "wet" media results in a homogeneous mixture of the multi-component composition of solid particles. An application of such a suspension makes possible adjusting, improving and employing a set of very workable and inexpensive forming and thermal treatment methods producing all useful forms of the superconductor materials. This makes possible inexpensive and scrap-free manufacturing of the quality assured HTS materials.

In keeping with these objects and with others, which will become apparent hereinafter, one key feature of the present invention, briefly stated, is a superconductor composite material composition which comprises a sintered compound of intermixed components including high temperature superconductor ceramics and sintering products of interaction of said superconductor ceramics with silicone material.

SC composite or the superconductor ceramic composite, or SCC, material formulations include a preparation of the suspension of SC ceramics selected from the group consisting of, for example, $YBa_2Cu_3O_{7-x}$ (Y—Ba—Cu—O or Y123) and $Bi_2Sr_2Ca_2Cu_3O_{10}$ ceramics, and a material selected from the group consisting of rubber silicone and lacquer silicone. The formulations include forming a material, treating the formed material chemically, thermally, mechanically, and physically. These result in SC composite (SCC) material in a form of the particular SCC geometric form. When the material is composed of the above-mentioned components and the final SCC material is produced applying above-mentioned highly workable material formulation, it eliminates the disadvantages of the prior art and provides for highly advantageous practical results.

The preparation and application of the ceramic slurry is provided in a polymer emulsion of the silicon rubber in toluene or acetone solvent since the applied ceramics degrades in water media and in open-air.

In accordance with another feature of the present invention, a dope or additive can be also included from the group consisting of metal elements, Ag, Au, Pt, Cs, and Ni, alkaline earth elements, Ca, Sr, metal oxide compounds, $Al_2O_3$, halogen elements, Br, rare earth elements and sintering products of interaction of said dope elements or compounds with said superconductor ceramics, silicone and its burnt residuals.

The following methods can be used to make corresponding materials and products:

adhesive dip coating of the continuous filament substrate core in the invented slurry to produce continuous SCC filaments for later combining and twisting into wires, coils, and cables;

slip casting or painting or jet-printing or application of the "doctor blade" method for coating of, or cladding on, the continuous tape or ribbon substrate by the invented slurry to produce continuous SCC tapes for combining these tapes into wires, coils, and cables;

film casting or 2D and 3D printing on a silver or quartz glass (silicon) chip-like substrate to produce some SCC electronics elements and devices;

spraying or spattering of the invented suspension or slurry on the large-size substrate surface, producing, for example, radar shields or high sensitive antennas.

Also there can be used:

extrusion or injection molding of the plastic mass from condensed suspension to produce, for example, long-length HTS rods, tubes, rails or beams;

ordinary or hot isostatic pressing of the dry powder mixture from condensed and dried suspension to produce products with complicated or particular shapes, such as tablets, rings, tile or bolls.

Silicone just a little bit interacts with copper, barium, and rare earth oxide ceramics while silicone polymer film covers ceramic particles preventing their degradation up to 500° C.

When HTS ceramic powder and silicone polymer and metal dope are heated, silicone components are subjected to destruction and organic radicals are burnt out from the silicone, which leads to the formation of silicon, silica and carbon crystals. Then, silica reacts with carbon to form silicon carbide and gas: $SiO_2 + 3C \rightarrow SiC + 2CO\uparrow$.

The silicon carbide, silicon, silica and carbon are uniformly distributed in the composite material body. Additionally, during high temperature thermal treatment some components of the composite ceramic material interact with the silica and carbon, so as to form different composites, for example $Ba_2SiO_4$, SiC, etc. This was confirmed by an X-ray phase analysis.

The silicone residuals and products of their reactions are ceramic sintering aids and microwave susceptors.

Additionally, these residuals and the products of their reactions together with metal dope (when it is used) prevent degradation of superconductor ceramic products, provide ductility and increase flexibility of the shaped material.

As Ginzburg's physical theory explains, one scientific phenomena discovered and employed in this invention is the cause of the superior electrical-magnetic properties of the invented composite material. This theory says that small quantity of the particular micro impurities can improve superconductor properties of high temperature superconductor ceramics and prevent overheating of the ceramic body micro-shunting thermal and electrical current quenches. Silicone residuals and products of their high temperature reactions and metal dopes play the role of such especially useful impurities, which actually are additives. They pin electrical current vortexes increasing electrical conductivity of the HTS ceramics.

Homogeneous distribution of the solid micro-particles of the ceramic and, for example, metal powders in the liquid silicone-based carrier causes a workable suspension, which is a colloid system. The ceramics-dope suspension or slurry makes possible homogeneous and uniform adhesive precipitation cladding of the solid particles on the metal or quartz or nickel or ceramics, or carbon filament or tape substrate. The same ceramics-dope-silicone colloid suspension or slurry can be dried, which consequently causes densification or condensation of the above-mentioned suspension into a plastic mass and then into dry powder mass. Consequently these masses are suitable for application of extrusion or pressing forming methods. Thus, silicone additive provides formability of superconductor material composition helping intermixture homogenization and working as a plastic binder. The silicone binder also help adhesion and protects coating layer or a film or a shape of the bulk product in a stable form up to the time of the polymerization and sintering processes that provide final hardening and shaping of the products.

The invented raw material composition and related wet method of the raw material preparation make possible an innovative application of the set of traditional and very effective forming methods of the Chemical and Ceramic Engineering. Consequently these methods are highly suitable for industrial conveyer and cost-effective mass production of the superior and quality assured HTS composite materials. This material composition can be used for forming a continuous superconductor wire, coil and broad range of materials and products for electrical and electronics industries.

Employing the same HTS ceramics suspension, it is possible to manufacture three groups of SC materials and products that actually cover all known and potential product demands of the Electrical, Electronics and Internet/telecommunication industries and various worldwide techniques:

various large-size products, for example, radar screen-shields, continuous bars and beams for levitation vehicles and other devices, electrical energy storage wheels, and non-noisy and non-wear bearings;

various films, super-tiny and precisely shaped electronic products, for example, chip elements for super-capacity and super-speed computers, controllers, the third generation of the signal retranslating filters for wireless telephone that will be suitable for Internet and image translation, underground telephone systems, supersensitive electronic devices for different applications, including medical needs, etc.;

continuous filament or tape combined wire, coil and cable of any electrical engineering design and nomenclature, for example, for high power electrical distribution net and smaller motors, power generators, transformers, super-stable and super-power magnets, for example, for MRI diagnostic systems and an accelerator of elementary physical particles.

The novel features, which are considered as characteristics of the present invention, are set forth in particular in the appended claims.

DESCRIPTION OF THE PREFERRED EMBODIMENTS

A material in accordance with the present invention is based on an integration of two scientific and engineering discoveries that make possible an appropriate formulation of the HTS composite material on the base of HTS raw material ceramic powder.

The first discovery is as follows. After firing and hardening (sintering) of the superconductor ceramics formed with silicone, the invented SC material keeps silicone residuals, including SiC micro-crystals and products of the thermochemical reactions of the residuals and silicone components with different oxides of the SC. These residuals and products with or without a specifically determined percentage of dope are homogeneously distributed within the SC body. These additives of the SCC material significantly increase electric conductivity and magnetic resistance and they also sufficiently increase and improve compressive and tensile strengths, ductility, and ambient resistance of SCC composite material and its shaped (formed) products.

The second and concurrent scientific discovery consists of the application of one basic principle of Ceramic Engineering. Indeed, completely uniform and homogeneous distribution of the solid particles of different shapes and densities in some intermixture can be achieved only in liquid media after particular stirring or ultrasonic impact. This automatically causes, for example, homogeneous precipitation on and uniform coating of the substrate plate, filament or tape. Vaporization-densification of the homogeneous solid particle dispersion into a ceramic mass should produce a homogeneous particle compound with a silicone binder, which should be suitable for plastic forming including extrusion and injection molding. Farther drying of the same slurry makes possible dry pressing at room and higher temperatures.

In accordance with the present invention a superconductor composite material comprises a sintered compound of intermixed components including high temperature superconductor ceramics and sintering products of interaction of said superconductor ceramics with silicone material.

All cost effective forming methods result in high workability, adaptability for different products, reliable quality and process control resulting in virtually scrap-free manufacturing. This makes it possible to produce all necessary SCC materials and end products for the Electrical, Electronics and Internet/telecommunication industries.

Superconductor composite materials can be in forms of coated substrate elements from the groups consisting of a filament, a wire, a tape, a coil, a chip, and a screen. An invented superconductor composite material can be also in forms of articles from the group consisting of long-length and different bulk-shaped structures that do not apply substrates.

Silicone residuals and products of their reactions with HTS ceramics inhibit degradation of superconductor properties of the superconductor composite material under impact of the natural atmospheric $CO_2$ and $H_2O$ gases and nitrogen or oxygen coolants. As the result, SCC material keeps superconductor electrical and magnetic properties after 700–1000 cyclic submerges in-out of liquid nitrogen in comparison with known HTS ceramics that lose their superconductor properties after 100–140 submerges into liquid nitrogen.

One focus of the invention is to develop and implement a manufacturing technology of SCC wire and tape as well as coil and cable. Meanwhile, the invented SCC material also permits the manufacture of miscellaneous superconductor products such as radar-insulated shields, sensors, and levitation devices of any shape and size.

The invention solves twelve major scientific and engineering problems found in the presently employed technological methods of production of superconductor wire and tape, including previously applied dip coating, Doctor Blade or tape casting methods using traditional liquid carriers, such as alcohol, and "powder in tube" and "laser beam deposition" of dry powder.

The list of the common technical problems that this invention solves include:

1) Superconductor ceramics are brittle and cannot be originally cut, polished or drilled;
2) Original superconductor ceramics degrade both during the production process and a service period in a conventional air environment and liquid nitrogen coolant media, significantly decreasing their superconductor properties;
3) Original superconductor ceramic powder was not formable for continuous wire, tape and specially shaped bulk products, such as continuous rods, beams or rails for levitation trains, electricity storage wheels or multilayer 3D electronic chips;
4) Original superconductor ceramics lose oxygen from its crystal lattice during the ceramic firing process that results in an unavoidable loss or significant decrease of superconductor properties;
5) Existing methods of material preparation and forming of the ceramic article from dry powder cannot yield, at a commercially acceptable cost, end materials due to non-homogeneity of the formed ceramic body that are necessary for electrical current flow through sintered ceramics. Additionally, if we add some powder dope, the non-homogeneity would be increased;
6) Existing methods of forming the ceramic article from dry powder until now could not result, at a commercially acceptable cost, in the conveyor and fully automatic production of scrap-free and quality assured continuous wire and tape, as well as cable, rods, beams, and rails;
7) High density and full integrity superconductor ceramic products should be produced with special grain alignment within the ceramic body, which will result in the highest superconductor electrical and magnetic properties of the SCC materials and products;
8) The electrical current density of the SCC material may be controlled and significantly increased by a metal dope even though the best type of metal and optimal percentage of the dope were unknown; and
9) If some metal substrate is applied, according to existing dip coating and IBAD techniques, superconductor ceramics did not stick to the metal or alloy material substrates without additional and expensive treatment of the substrate.

Concurrently the invention improves magnetic flux pinning, minimizes weak links in Y123 or BCCO ceramic grains, increases the wire strength, decreases the cost of the wire sheathing, and eliminates density variations of the coating layer.

The invented high temperature superconductor composite material is a material which works at liquid nitrogen and higher temperatures K>77 with critical current density $J_c>10^4 A/cm^2$ and value of critical magnetic field $H_c$ within the range of 0.1–30 Tesla. In particular, it can work with the critical current density $J_c$ of $10^3 A/cm^2$–$10^6 A/cm^2$. The new high temperature superconductor (HTS) composite material in accordance with the present invention has specific impact strength within the range of 0.5–2 $kg.cm/cm^2$, and a long-time durability compatible with a conventional metal wire at working temperatures and conventional ambience.

In the new material the synthetic silicone rubber or lacquer has molecular weight in the range of 20,000–800,000, such as a synthetic silicone rubber $HO-[-Si(CH_3)_2 O-]-H$ with a molecular weight 30,000–40,000, and this synthetic silicone rubber or lacquer should be presented in an emulsion of the components in the mass ratio 1–10%, for example, 2–5%.

If a silicone rubber is used, the suspension mixture should include diethylaminmethylthrietoxisilane in a ratio of 2%–10%, for example, five weight percent of the weight of the silicone rubber, to accelerate the vulcanization process of the silicone rubber. The polymerization process allows long-time storage of the semi-product if a consequent firing process should be provided in another place or after some period of time.

The shaping of the SCC material can be performed either by direct applying of the above suspension, for example, by using a chemical-adhesive coating method or by extrusion of the plastic mass or by pressure of the dry mass condensed from the same suspension. Pressure can be provided, for example, at 300 MPa either at room or high temperature, such as 850° C.

The forming methods to produce a continuous high temperature superconductor filament or tape include a use of the substrate filament or tape. Substrate materials are selected from the group consisting of a metal, for example silver or nickel, or alloy, or quartz glass or ceramics or carbon fiber or carbon fiber fabric or glass-like carbon. Then there are provided coating a surface of the substrate by at least one layer of the SCC material; processing the coating substrate by a process selected from the group consisting of chemical processes, physical processes and thermal processes, using a conveyor consequence of the steps; and sheathing of the thusly produced product with a material selected from the group consisting of a polymer material and/or a metal sheath.

An adhesive primer layer is applied on the filament or tape substrate. The substrate filament or tape can be also composed of nickel, silver or some ceramics or quartz glass. Then a high temperature superconductor composite material based on a suspension mixture of high temperature superconductor ceramics with silicon-organic polymer and, for example, silver powder dope is clad on the adhesive layer, and finally a protective layer of silicone or another material could be applied.

The method further includes precipitating an adhesive primer based on epoxy lacquer or pitch with the addition of a silver powder and a polymerization aid on the filament or tape based on the quartz glass or metal, which should be silver or, for example, annealed nickel.

Furthermore a homogeneous suspension mixture of three above-mentioned major components of the high temperature superconductor composite material is produced while a solvent for silicone emulsion is either toluene or acetone.

The invented HTS material preparation method includes finally hardening of the high temperature superconductor filament or tape by ceramic sintering in an electrical tube furnace with automatic controller of the temperature mode. The process duration is 4–30 hours at low oxygen pressure or oxygen flow at 700–1200° C. (900–950° C. if we use Y—Ba—Cu—O). Otherwise final hardening of the high temperature superconductor filament or tape is provided by ceramic sintering in a microwave supported electrical furnace during 1–5 hours in excess of air or oxygen flow (at 870–920° C. for Y—Ba—Cu—O ceramic composite).

The thusly-produced high temperature superconductor filaments or tapes are compacted and twisted to form a designated high temperature superconductor wire. A silicone polymer covering to perform sheathing and sealing of the high temperature superconductor wire is provided by applying a vulcanization technique. Otherwise the high temperature superconductor wire can be stretched through copper, silver or another capillary or a tube. Finally, the flexible SCC wire can be wound in a coil or combined into a cable.

The special advantage of the invention is the high workability and formability of the invented raw material composition. It makes it possible to provide conveyor production of the quality assured high temperature superconductor products for all areas of possible application of the high temperature superconductors using the same composition of the raw materials in the same form of the suspension (superconductor compound suspension) or slurry. The suspension composition includes solid and liquid components. There is HTS ceramic powder, silicone emulsion in toluene or acetone solvent, and the slurry can additionally include powder dope.

Thus, the first step is preparation of the raw materials composition suspension and making it ready for use with all additives and ingredients. The typical second step is shaping or forming of the green compound in the form of either a suspension (slurry) or plastic mass into useful material form, such as wire, tape, rod, rail, disk or chip. The third step includes a few physical and thermal treatments of the shaped green material and the fourth step consists of a firing process including burning out of the organic components, heating, sintering, and cooling steps that convert the green material body into practically useful superconductor composite material.

Six shaping (forming) methods can be used, including:

1) and 2) Adhesive dip-coating to coat (clad) powder compound suspension or slurry on metal or alloy or ceramics or quartz glass or carbon fiber or carbon fiber fabric filament or tape substrate to produce continuous SCC filaments or tapes that can be further combined in wire, coil and cable. These products have to satisfy requirements of all traditional electrical engineering applications, such as smaller and more powerful electrical motors, generators, turbine rotors, transformers, distribution nets and some innovative or unique advanced applications, such as storage magnet energy systems (SMES), MRI, and super-power magnets for physical particle accelerators.

3) Molding (casting) of one or several thin film layers of the invented SCC suspension or slurry on metal or alloy or ceramics or quartz glass or carbon fiber or carbon fiber fabric substrate to produce two or three-dimensional high temperature superconductor films. The structure of the HTS film can copy the substrate shape structure or its buffer layer. Otherwise, a laser can burn out an especially precise high temperature superconductor two- or three-dimension structure of the electronic elements. The films can be applied, for example, for super-capacity memory and super high-speed elements of computers and controllers, various supersensitive electronic devices, such as wireless and underground telephone systems and their use for Internet and imaging translation.

4) Spraying, spattering or casting (molding) of the invented SCC suspension on metal or alloy or silver or ceramics or quartz glass or carbon fiber fabric or glass-like carbon substrate surface of the large perimeters to produce radar shields, super-sensitive and superpower radio antennas and telescopes.

5) An extrusion or injection molding of the condensed plastic mass from the invented SCC suspension to produce large size and long-length HTS products, such as rods, beams, rails and plates for levitation bases and durable energy storage wheels.

6) Ordinary pressing at room temperature or hot isostatic pressing of the condensed dry mass from the invented SCC suspension to produce similar products to that listed in point 5 above as well as products with particular shape, for example, tablets or disks.

Ceramic technology is based on both art and science, and it is usual during the last hundred years when success in development of advanced electrical, electronics and other technical ceramics is determined by some casually or consciously found additives and methods of their applications. We believe that we found such a key additive for the technology of superconductor ceramics.

The invented inexpensive silicone additive to HTS ceramics and its application play nine useful roles and their synergy provides unique advantages for SCC materials and associated technology:

1. Inhibition of the degradation of the HTS ceramic powder at all production stages, including material preparation, forming and sintering of the SCC article.
2. A dispersant aid in obtaining homogenization of the ceramics and dope particles in intermixed suspension in toluene or acetone.
3. An adhesion aid in applying material suspension or slurry for adhesive coating of continuous wire and tape substrates.
4. Plastic binder for pressing, extrusion and other forming of the condensed suspension mass.
5. Polymerization hardening matter for the formed semi-products, which keep their forms for further treatment, including handling, transportation and temporary storage.
6. Stimulator of ceramic grain alignment in the form of equal-size spirals or helixes that probably induce the better superconductor properties of the SCC composite material.
7. Sintering aid since additive residuals react with YBCO and other ceramic components producing some eutectics and accelerating diffusion sintering that increases ceramic body integrity.
8. Additive residuals and products, such as SiC, induce durability and reliability of the SCC material in conventional air conditions and in nitrogen cooled environments.
9. Additive residuals and products together with metal dopes provide ductility of the SCC composite material, which makes possible its polishing, cutting and drilling as well as an increase in flexibility and strain tolerance of SCC wire, tape, chip and screen.

Additionally, the invention employs four important innovations:

Inexpensive polymer composition of the epoxy glue and silver powder with high adhesion properties and advanced methods for separate polymerization heating. This glue-metal layer can also be oriented by magnetic impact, which produces a template for grain alignment and orientation of the coating layer of the superconductor ceramic composite;

The glue-metal composition can be used as a substrate adhesive primer and can replace expensive indium providing contacts between the HTS ceramics and the alloy or copper current carriers;

Silicone based inexpensive composition and quality assured methods of its use for safe sheathing and outside isolation of the HTS products at liquid nitrogen temperatures, initially continuous wire and cable; and Application of inexpensive annealed nickel, quartz fibers and glass-like carbon and quartz fiber fabrics as a replacement for expensive silver substrates.

The presence of the third component in the invented SCC, which is a dope, is in some cases unnecessary. While a dope search is continuous, provided works determined a few groups of the dopes and a lot of dope combinations. There are noble metals, including Ag, Au, and Pt alkaline metals, including Cs alkaline earth metals, including Ca, Sr metal oxides, including $Al_2O_3$ color metals, including Ni rare earth elements, including most of them halogen elements, including Br.

The dopes and their combinations work in strong synergy with particular HTS ceramics and silicone and its residuals and products in sintered material. Taking this synergy into account, the listed dopes can play nine major roles providing additional advantages for this new SCC material technology, properties and applications, such as:

1. Sintering aid or catalyst, which can increase sintering velocity accelerating thermal diffusion.
2. Chemical reagent, which can induce some eutectics providing incongruent melting.
3. To control grow or improve crystal morphology.
4. To provide "metal" contacts between ceramic crystals in the sintered body, which provides both electrical and thermal shunting of the SCC material during its service.
5. Component, which increase material reliability and durability at room and liquid gas temperatures.
6. Component, which increases material ductility, flexibility and strain tolerance.
7. Soldering component, which provides metal-ceramics interaction and integrity for the pair "metal substrate—HTS ceramics".
8. Component, which is used to provide contacts between current leads from the same or different conductors, for example, between superconductor ceramic composite and copper wires.
9. To increase electrical conductivity and magnetic resistance of of the HTS material.

The silicone component in the raw material suspension can be presented in an amount of 0.1%–12% weights of the superconductor ceramics while the most workable range is 1%–6%. As shown by x-ray analysis, some compounds can be produced due to interaction of Si with heavy elements of HTS ceramics, such as Y, Sr, Ba, Pb, and Cu. Therefore, a weight percentage of silicone residuals and silicon-content compounds in sintered SCC materials can be in the range 0.1%–10%.

While dopes in raw material suspension can be presented even in a trace amount, a more common range is 0.01%–25% weights of the superconductor ceramics, it depend on types of the dope elements, their combinations and particular purposes of their use. As shown by x-ray analysis, some compounds can be produced due to interaction of dopes with Si, C and with heavy elements of HTS ceramics, such as Y, Sr, Ba, Pb, and Cu elements. Therefore, weight percentages of dope-content residuals and compounds in sintered SCC materials can be in the range 0.01%–30%.

Eight examples of the raw material compositions of the invented SCC suspensions or slurry that are suitable to produce various SCC materials for different material products are presented as follows:

EXAMPLE 1

A raw material composition of the superconductor wire includes:

a superconductor ceramic powder $YBa_2Cu_3O_7$—92.5 weight parts;

organo-silicate elastomer or silicone rubber HO—[—Si$(CH_3)_2$O—]—H—5 weight parts;

dialkylaminomethyltrialkoxysilane—5 weight percents from the weight of the silicone rubber, which is a polymerization aid;

silver powder—2.5 weight parts; all in a toluene solution.

EXAMPLE 2

A raw material composition for superconductor tape produced on a conveyor line includes:

a superconductor ceramic powder $YBa_2Cu_3O_7$—93.5 weight parts;

organo-silicate elastomer or silicone rubber HO—[—Si$(CH_3)_2$O—]—H—5 weight parts;

silver powder—1.5 weight parts; all in a toluene solution.

EXAMPLE 3

A raw material composition includes:

a superconductor ceramic powder $YBa_2Cu_3O_7$—95 weight parts;

polyvinyldimethylsiloxane rubber—5 weight parts;

dialkylaminomethyltrialkoxysilane—4.5 weight percents from the weight of the silicone rubber, which is a polymerization aid;

all in a toluene solution, 300 weight percents of toluene from the weight of the silicone rubber.

EXAMPLE 4

A raw material composition includes:

a superconductor ceramic powder $YBa_2Cu_3O_7$—94.9 weight parts;

polyvinyidimethylsiloxane rubber—5 weight parts;

platinum powder—0.1 weight percent;

all in a toluene solution, 200 weight percents of toluene from the weight of the silicone rubber.

EXAMPLE 5

A raw material composition includes:

a superconductor ceramic powder $YBa_2Cu_3O7$—96.4 weight parts;

$HO-[-Si(CH_3)_2O-]-H$—2.5 weight parts;

polyvinyldimethyl silcoxane rubber—2.5 weight parts;

silver powder—1.0 weight percent;

platinum powder—0.1 weight percent, all in an toluene solution; 100 weight percents of toluene from the weight of the silicone rubber.

EXAMPLE 6

A raw material composition includes:

a HTS ceramic powder $Bi_2Sr_2Ca_2Cu_3O_{10}$—94 weight parts;

organo-silicate elastomer rubber $HO-[-Si(CH_3)_2O-]-H$—5 weight parts;

dialkylaminomethyltrialkoxysilane—5 weight percents from the weight of the silicone rubber, which is a polymerization aid;

silver powder—one weight percent; all in a toluene solution.

EXAMPLE 7

A raw material composition includes:

a superconductor ceramic powder $Bi_2Sr_2Ca_2Cu_3O_{10}$—95 weight parts;

$HO-[-Si(CH_3)_2O-]-H$—5 weight parts;

all in a toluene solution, 400 weight percents of toluene from the weight of the silicone rubber.

EXAMPLE 8

A raw material composition includes:

a HTS powder $Bi_{1.8}Pb_{0.4}Sr_2Ca_2Cu_3O_x$—93 weight percents; organo-silicate elastomer $HO-[-Si(CH_3)_2O-]-H$—5 weight percents;

dialkylaminomethyltrialkoxysilane—5 weight percents from the weight of the silicone rubber, which is a polymerization aid;

silver powder—one weight percent;

calcium powder—one weight percent;

all in a toluene solution.

EXAMPLE 9

A raw material composition of the superconductor wire includes:

a superconductor ceramic powder $YBa_2Cu_3O_7$—93 weight parts;

organo-silicate elastomer or silicone rubber $HO-[-Si(CH_3)_2O-]-H$—5 weight parts;

dialkylaminomethyltrialkoxysilane—5 weight percents from the weight of the silicone rubber, which is a polymerization aid;

zirconium oxide powder—2.0 weight parts; all in a toluene solution.

EXAMPLE 10

A raw material composition for superconductor tape includes:

a superconductor ceramic powder $YBa_2Cu_3O_7$—92 weight parts;

organo-silicate elastomer or silicone rubber $HO-[-Si(CH_3)_2O-]-H$—5 weight parts;

dialkylaminomethyltrialkoxysilane—6 weight percents from the weight of the silicone;

nickel powder—3.0 weight parts; all in a toluene solution.

EXAMPLE 11

A raw material composition includes:

a superconductor ceramic powder $YBa_2Cu_3O_7$—95 weight parts;

polyvinyldimethylsiloxane rubber—4 weight parts;

dialkylaminomethyltrialkoxysilane—5 weight percents from the weight of the silicone rubber, which is a polymerization aid;

Br powder—1.0 weight part; all in a toluene solution.

EXAMPLE 12

A raw material composition includes:

a superconductor ceramic powder $YBa_2Cu_3O$—93 weight parts;

polyvinyldimethylsiloxane rubber—5 weight parts;

dialkylaminomethyltrialkoxysilane—5 weight percents from the weight of the silicone;

alumina ($Al_2O_3$) powder—0.5 weight percents;

silver powder—1.5 weight percents; all in a toluene solution.

EXAMPLE 13

A raw material composition includes:

a superconductor ceramic powder $YBa_2Cu_3O$—93 weight parts;

polyvinyldimethylsiloxane rubber—6 weight parts;

silver powder—0.95 weight percent;

cesium powder—0.05 weight percent; all in a toluene solution.

A formulation of the HTS ceramic composite material to produce high temperature superconductor filament is illustrated by the following example.

EXAMPLE 14

A nickel filament with the thickness of 125 microns is degreased by acetone, then immersed into a bath with epoxy silicone lacquer dissolved in acetone with the silver powder and hardened by malein or phtalein anhydride (30–35 weight parts from the weight of the epoxy resin, hardened one hour at temperature of 130° C.). Then the filament is transferred from the bath and immersed or dipped into the next bath vessel containing a suspension consisting of a micron-size particles of Y—Ba—Cu—O ceramics, silicone polymer emulsion in toluene mixed by ultrasound mixer and silver in the form of powder with an average particle size of less than one micron. Then the filament is removed from the bath and grain orientation of the particles of polymer-ceramics in a magnetic field of 8 Tesla is provided. Then the filament with the oriented coating is introduced into a thermostat-controlled oven with heating from 100 to 320° C. during 0.5 hour. Then, the filament is sintered in an electrical tube furnace at the temperature of 920° C. in oxygen flow during 12 hours. Then in order to increase the stability of the properties of the filament to act in magnetic fields, the filament is subjected to irradiation treatment with the dose of $5.10^4$ Gy.

A material formulation to produce a HTS composite material in form of a solid disk is illustrated by the following example.

EXAMPLE 15

A quantity of silicon-organic rubber is dissolved in toluene and polymerizing agents are introduced into the mixture. Then, the mixture is stirred, the polymeric component of the material is mixed with the ceramics and gold powders in a corresponding ratio in a glass or YBCO ceramic vessel and slowly heated until the solvent is evaporated and a uniform mixture is produced. The resulting dry mixture is then introduced into a press mold and pressed with a pressure of 300 MPa in a magnetic field of 1–10 Tesla. Then the product is removed from the press mold, and after 24 hours of soaking is subjected to a thermal treatment at 100° C.–1 hour, 120° C.–1 hour, 150° C.–1 hour, and 200° C.–1 hour producing rubber stabilizing semiproduct material. This tablet can be stored for years without degradation of its potential superconductor properties. In order to impart superconductor properties to the product, it is sintered at a temperature of 930° C. in oxygen flow for 10 hours. A product can be made, for example, in the form of a disc or tablet, with a diameter of 30 mm and thickness 3–4 mm.

EXAMPLE 16

The invented material based on the bismuth ceramics $Bi_2Sr_2Ca_2Cu_3O_{10}$ was produced in a similar way, as it is described in Example 8. However, in order to impart to the product the superconductor properties the sintering of the product was performed at temperatures of 880° C. in air atmosphere for 48 hours.

It will be understood that each of the elements described above, or two or more together, may also find a useful application in other types of materials differing from the types described above.

While the invention has been illustrated and described as embodied in high temperature superconductor composite material, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by letters patent is set forth in the appended claims:

What is claimed is:

1. A method of producing a superconductor composite material, comprising the steps of providing superconductor ceramics and silicone material; and treating the superconductor ceramics and silicone material so as to produce sintering products of interaction of the superconductor ceramics with residuals of the burnt silicone material.

2. A method as defined in claim 1; and further comprising using as said silicone material rubber silicone or lacquer silicone.

3. A method as defined in claim 1; and further comprising providing in said superconductor composite material said sintering products of interaction of said superconductor ceramics with said residuals of the burnt silicone material in an amount of 0.1%–15.0% weight of total material weight.

4. A method as defined in claim 1; and further comprising using at least one dope or additive element selected from the group consisting of metal elements, Ag, Au, Pt, Cs, and Ni, alkaline earth elements, Ca, Sr, metal oxide compounds, $Al_2O_3$, halogen elements, Br, rare earth elements and sintering products of interaction of said dope elements or compounds with said superconductor ceramics, silicone and its burnt residuals in an amount of 0.1%–30% weight of total material weight.

5. A method as defined in claim 4; and further comprising mixing said superconductor ceramics and dope or additive in a silicone emulsion in toluene or acetone solvent resulting in a workable homogeneous suspension or slurry.

6. A method as defined in claim 5; and further comprising using said slurry for wet material processing selected from the group consisting of slip casting, molding, dip coating, painting, 2D and 3D printing, and spraying.

7. A method as defined in claim 5; and further comprising coating by said slurry a substrate element selected from the geometrical group of three dimensional articles consisting of a continuous filament structure, a wire, a tape, a ribbon, a coil, a thin walled bulk article, a plate, a ring, a cup, a vessel, a disk, a surface of the tube or cable, a surface of the bulk article with a simple or complicated shape, a screen, a chip, and an electronic element.

8. A method as defined in claim 5; and further comprising coating by said slurry a substrate element selected from the group consisting of a metal, a silver, an alloy, a quartz glass, a carbon fiber, a glass-like carbon, carbon fiber fabrics, and ceramics.

9. A method as defined in claim 5; and further comprising forming said slurry into a plastic mass to press at room or higher temperature an element selected from the group comprising a short bulk-shaped structure, a ring, a disk, a tablet, a cylinder, a plate, a square, a shaped bulk structure, a vessel, and a cup.

10. A method as defined in claim 5; and further comprising condensing said suspension into a ceramic-plastic mass to extrude or provide injection molding of an element selected from the group consisting of a long bulk-shaped structure, a rod, a beam, a tube, and a rail.

* * * * *